(12) United States Patent
Gregory

(10) Patent No.: US 6,566,268 B1
(45) Date of Patent: May 20, 2003

(54) METHOD AND APPARATUS FOR PLANARIZING A WAFER SURFACE OF A SEMICONDUCTOR WAFER HAVING AN ELEVATED PORTION EXTENDING THEREFROM

(75) Inventor: John Gregory, Battle Ground, WA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/205,229

(22) Filed: Jul. 25, 2002

Related U.S. Application Data

(62) Division of application No. 09/364,140, filed on Jul. 30, 1999, now Pat. No. 6,451,699.

(51) Int. Cl.[7] ............................................. H01L 21/302
(52) U.S. Cl. ........................ 438/692; 438/690; 438/691; 438/693; 438/747; 216/88; 216/89; 216/90; 216/91; 216/92
(58) Field of Search ................................ 438/690, 691, 438/692, 693, 747; 216/88, 89, 90, 91, 92

(56) References Cited

U.S. PATENT DOCUMENTS 5,474,644 A * 12/1995 Kato et al. ............. 156/345.11
5,607,341 A   3/1997 Leach
5,637,185 A * 6/1997 Murarka et al. ........ 156/345.13
5,645,682 A   7/1997 Skrovan
5,702,292 A  12/1997 Brunelli et al.
5,762,536 A   6/1998 Pant et al.
5,783,497 A   7/1998 Runnels et al.
5,846,444 A * 12/1998 Edwards et al. ........ 156/345.11
5,914,053 A   6/1999 Masumura et al.

* cited by examiner

*Primary Examiner*—G Goudreau
(74) *Attorney, Agent, or Firm*—Maginot, Moore & Bowman, LLP

(57) ABSTRACT

A method of planarizing a wafer surface of a semiconductor wafer having an elevated portion extending therefrom is described. The method includes the step of positioning a fluid flow surface relative to the wafer surface so that (i) a space is defined between the wafer surface and the fluid flow surface, and (ii) the elevated portion of the semiconductor wafer is positioned in the space. The method also includes the step of advancing a fluid within the space so that the fluid contacts and erodes the elevated portion of the semiconductor wafer. An associated apparatus for planarizing a wafer surface of a semiconductor wafer having an elevated portion extending therefrom is also described.

19 Claims, 6 Drawing Sheets

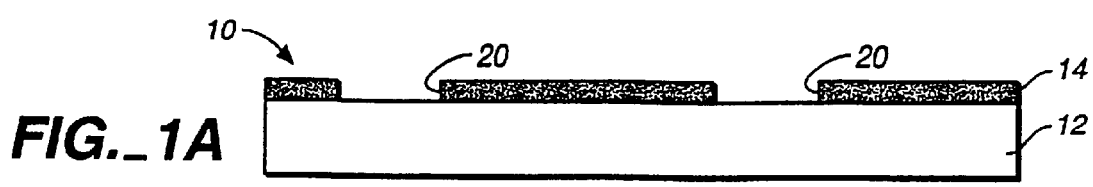
FIG._1A
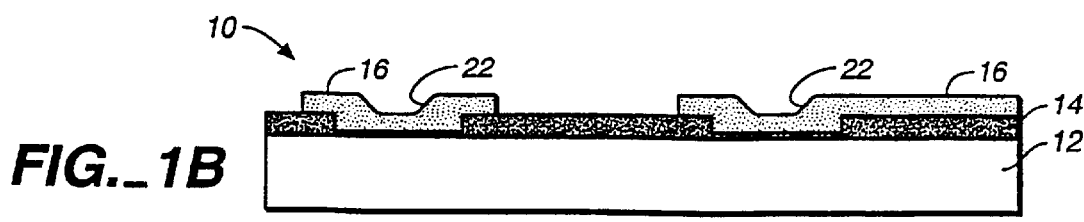
FIG._1B
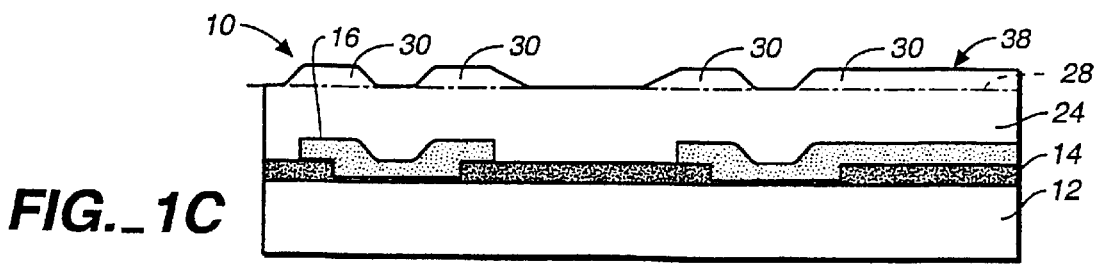
FIG._1C
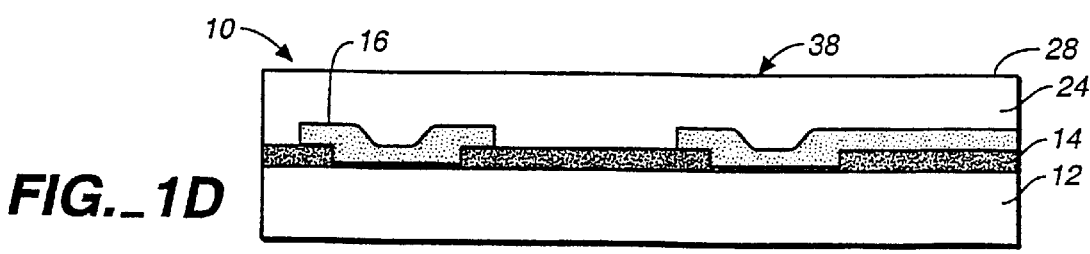
FIG._1D
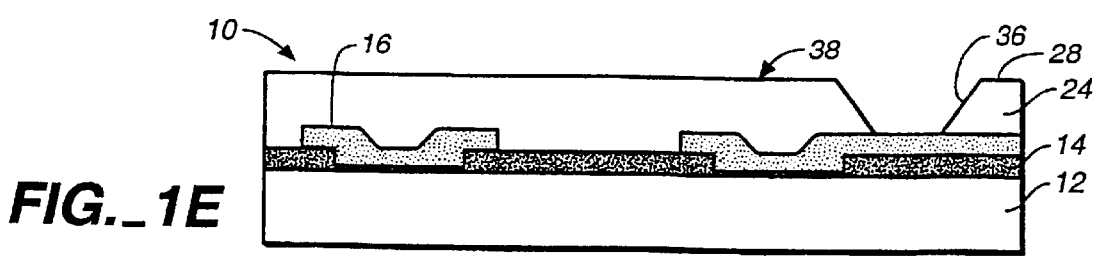
FIG._1E
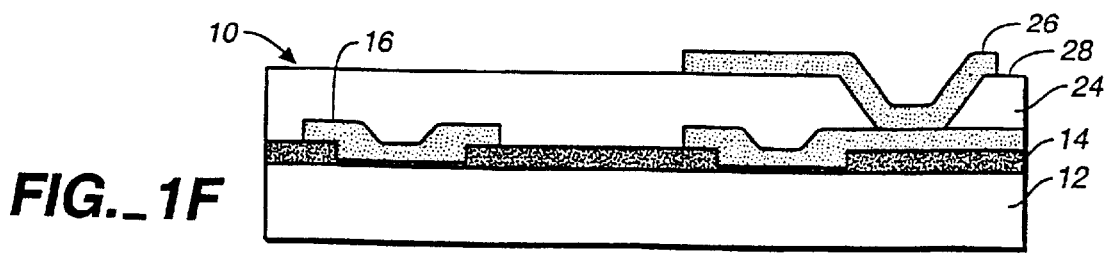
FIG._1F

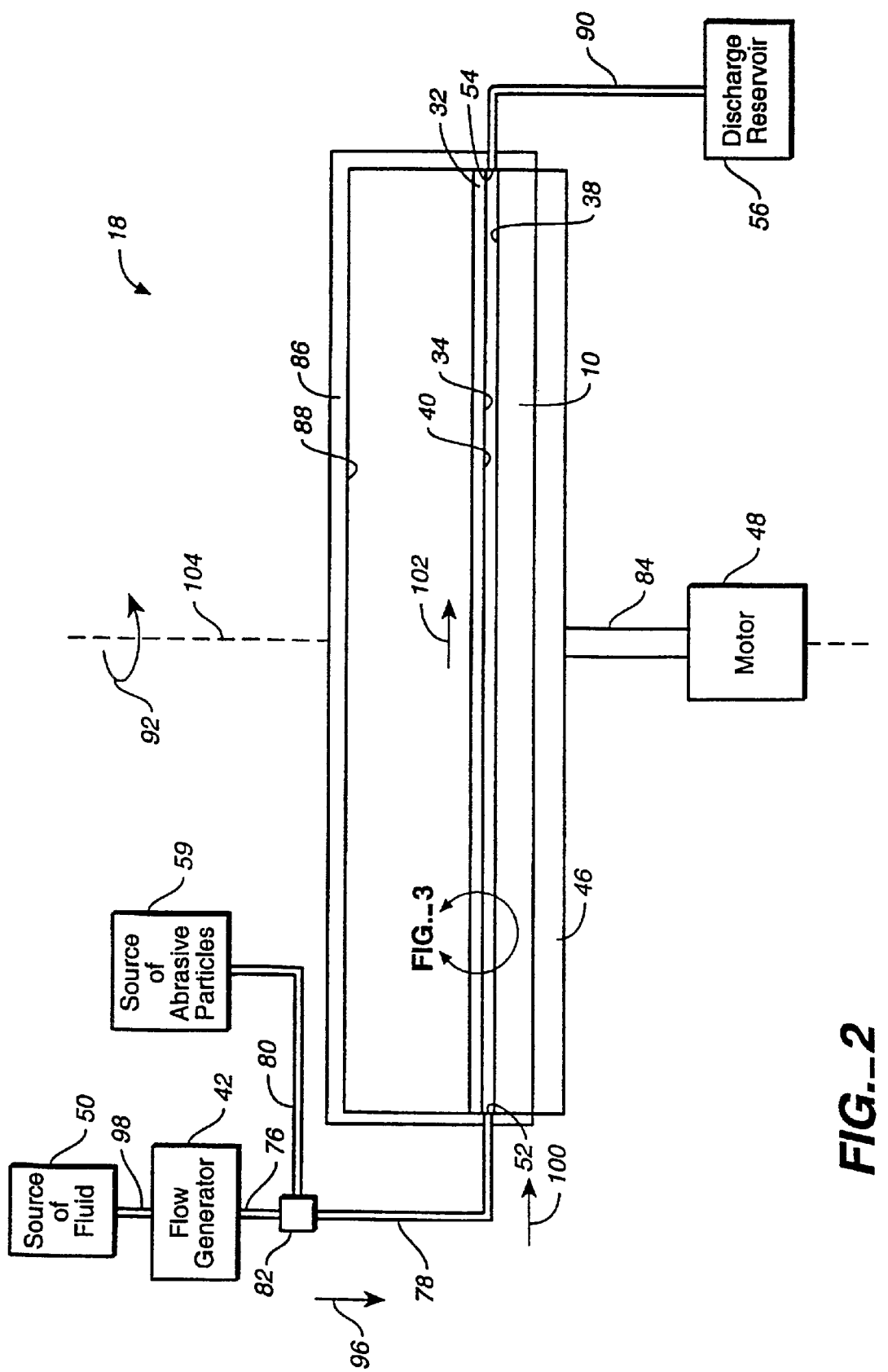
FIG._2

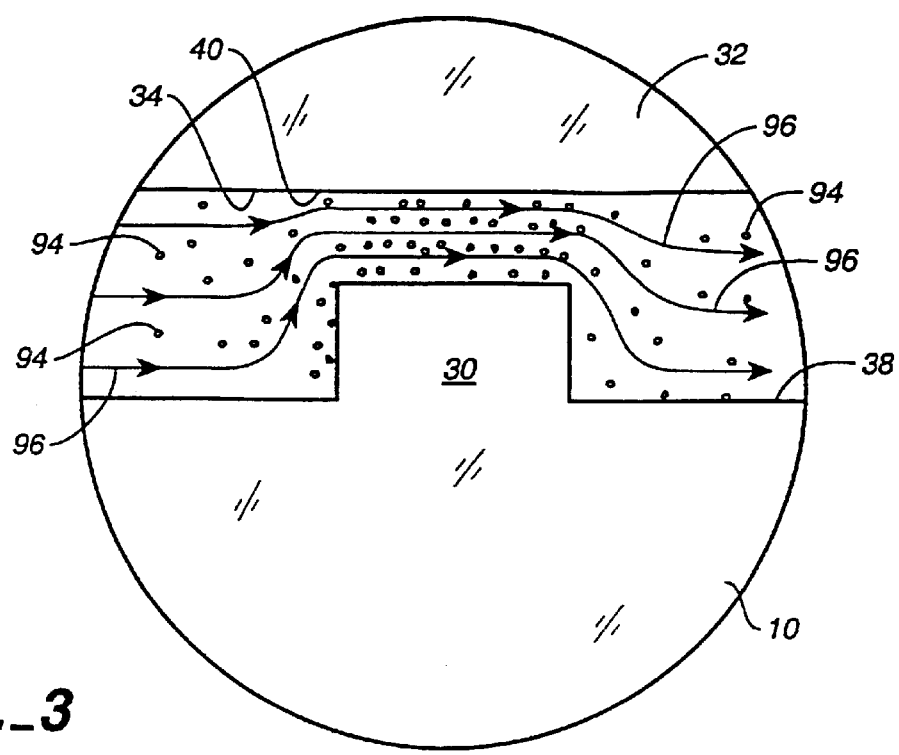
FIG._3
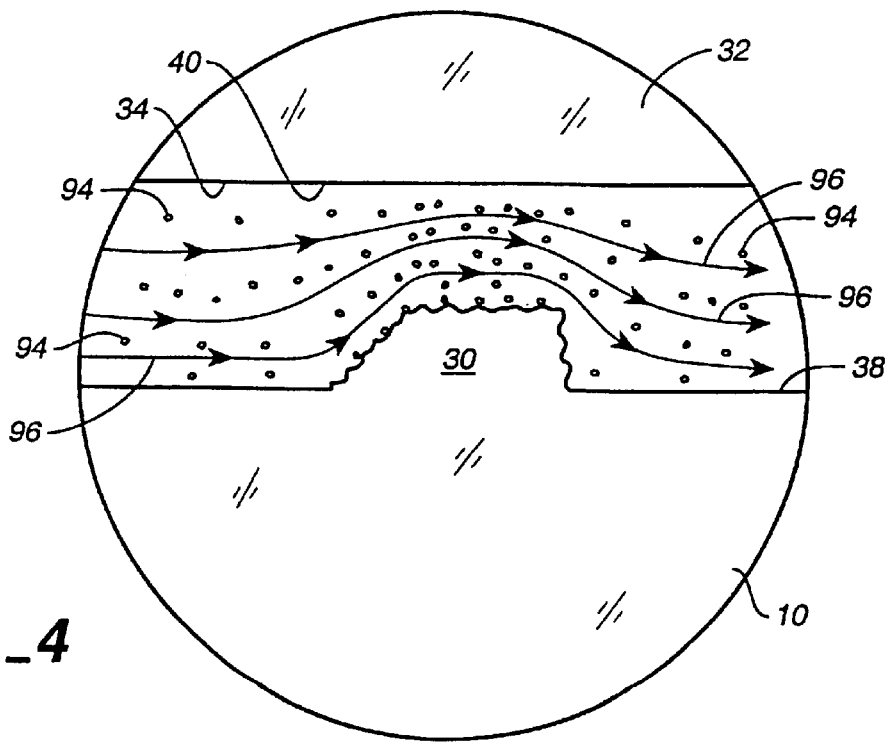
FIG._4

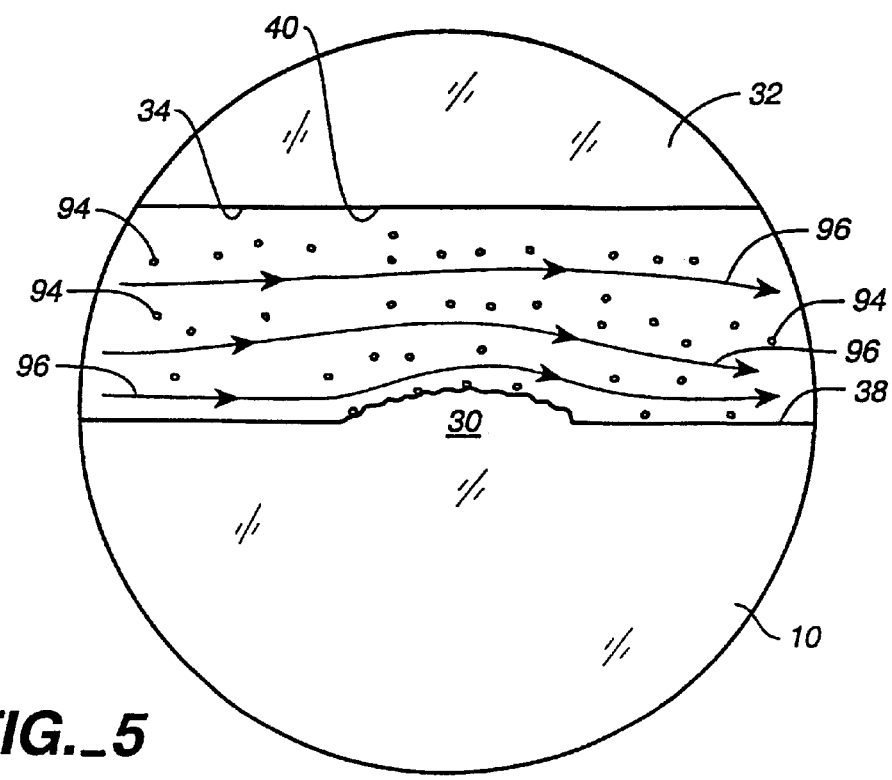
FIG._5
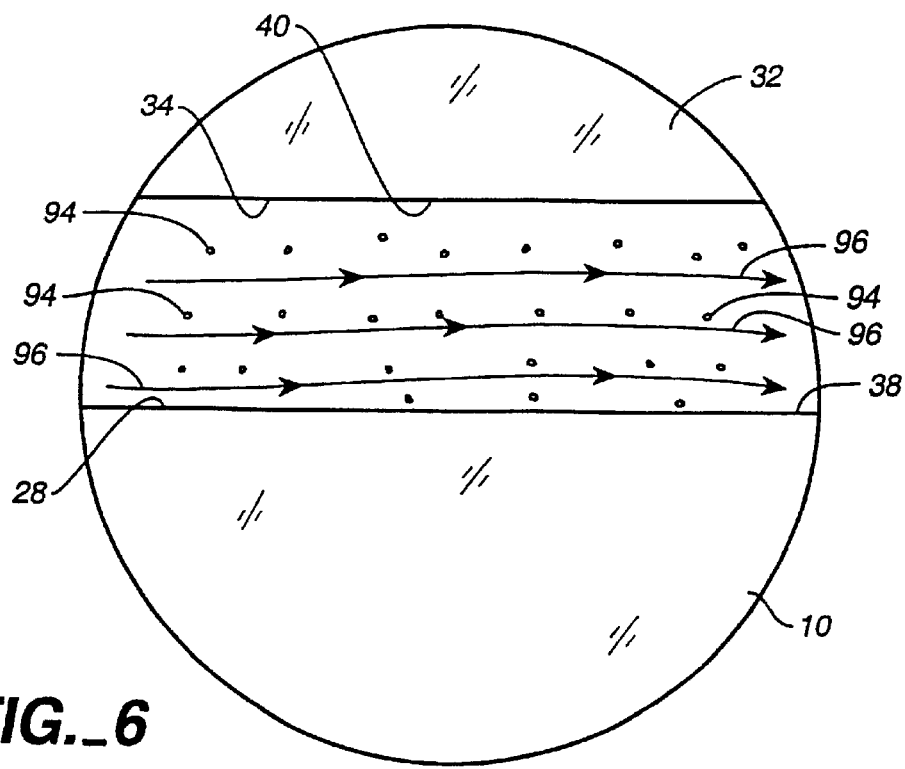
FIG._6

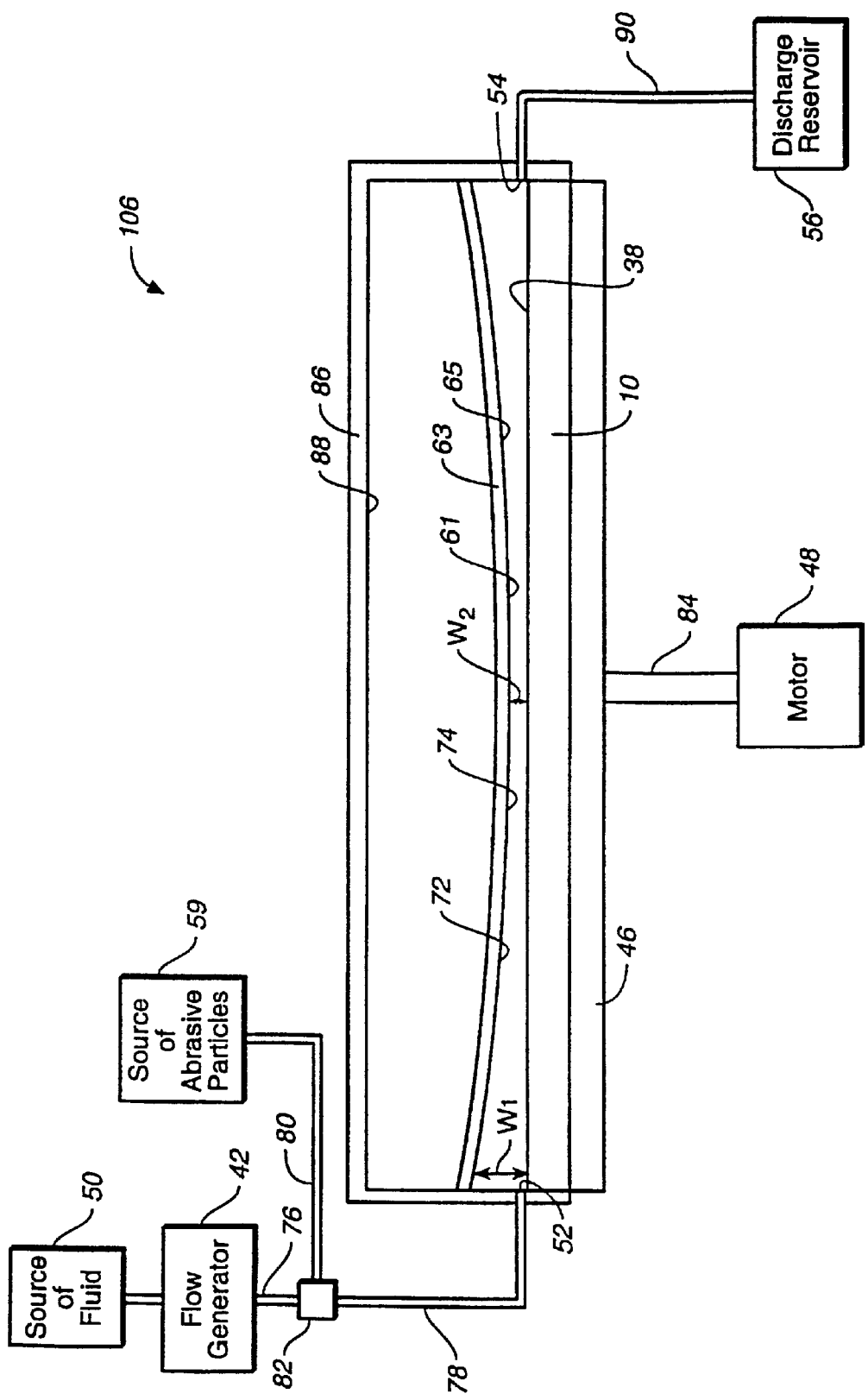
FIG._7

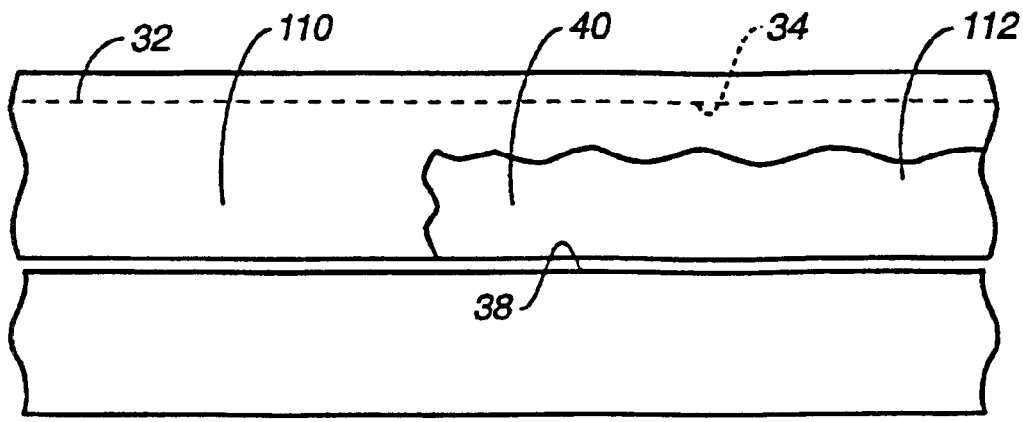
FIG._8
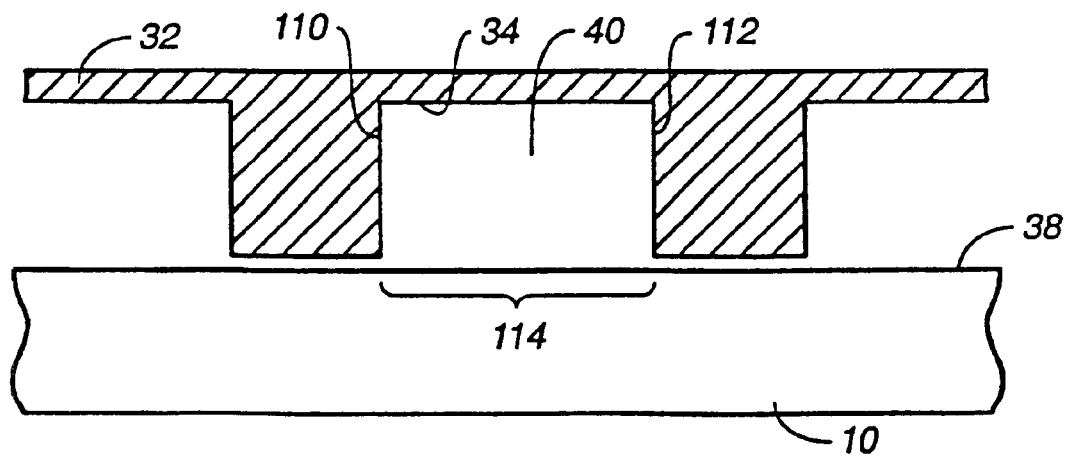
FIG._9

METHOD AND APPARATUS FOR PLANARIZING A WAFER SURFACE OF A SEMICONDUCTOR WAFER HAVING AN ELEVATED PORTION EXTENDING THEREFROM

This is a divisional of U.S. Pat. No. 6,451,699 which was filed on Jul. 30, 1999.

TECHNICAL FIELD OF THE INVENTION

The present invention relates generally to a method and apparatus for planarizing a semiconductor wafer, and more particularly to a method and apparatus for planarizing a surface of a semiconductor wafer by eroding a portion of the surface of the semiconductor wafer with a fluid.

BACKGROUND OF THE INVENTION

Semiconductor integrated circuits are typically fabricated by a layering process in which several layers of material are fabricated on or in a surface of a wafer, or alternatively, on a surface of a previous layer. This fabrication process typically requires subsequent layers to be fabricated upon a smooth, planar surface of a previous layer. However, the surface topography of layers may be uneven due to an uneven topography associated with an underlying layer. As a result, a layer may need to be planarized in order to present a smooth, planar surface for a subsequent processing step. For example, a layer may need to be planarized prior to the formation of a conductor layer or pattern on an outer surface of the layer.

In particular, a semiconductor wafer may be planarized to remove high topography features (i.e. elevated portions) which extend above the plane defined by the surface of the semiconductor wafer. The planarization process typically is accomplished with a system that includes a backing film or membrane which supports the semiconductor wafer during the planarization process. The planarization process also includes a polishing pad placed in contact with the semiconductor wafer. The polishing pad is moved relative to the semiconductor wafer thereby causing material to be removed from the surface of the semiconductor wafer. This planarization process is often referred to as mechanical planarization (MP) and is utilized to improve the quality and reliability of semiconductor devices. The above described planarization process may also involve the introduction of a chemical slurry to facilitate higher removal rates, along with the selective removal of materials fabricated on the semiconductor wafer. This planarization process is often referred to as chemical mechanical planarization or chemical mechanical polishing (CMP).

The above described processes (i.e. MP and CMP) effectively planarize semiconductor wafers, however these processes are relatively expensive to utilize. In particular, some of the components of each of these processes are consumed during planarization and therefore must be replaced. For example, the backing films or membranes which support the semiconductor wafer during the planarization process also wear out and must be replaced. In addition, the polishing pads utilized to planarize semiconductor wafers tend to wear out and thus must be periodically replaced. Polishing pads must also be treated with conditioners to be ready for use. The replacement of conditioners, pads, membranes, and other components increases the cost of manufacturing semiconductor wafers.

Furthermore, the machines used to perform MP and CMP tend to be mechanically complex and expensive. In addition, these machines are somewhat unreliable and expensive to maintain. These factors further increase the cost of manufacturing semiconductor wafers.

Thus, a continuing need exists for a method and an apparatus for planarizing a semiconductor wafer which is relatively inexpensive and reliable.

SUMMARY OF THE INVENTION

In accordance with a first embodiment of the present invention, there is provided an apparatus for planarizing a wafer surface of a semiconductor wafer having an elevated portion extending therefrom. The apparatus includes a fluid flow surface spaced apart from the wafer surface so that (i) a chamber is defined between the wafer surface and the fluid flow surface, and (ii) the elevated portion of the semiconductor wafer is positioned in the chamber. The apparatus also includes a flow generator for generating a flow of fluid which is advanced (i) through the chamber, and (ii) into contact with the elevated portion of the semiconductor wafer.

Pursuant to a second embodiment of the present invention, there is provided a method of planarizing a wafer surface of a semiconductor wafer having an elevated portion extending therefrom. The method includes the step of positioning a fluid flow surface relative to the wafer surface so that (i) a chamber is defined between the wafer surface and the fluid flow surface, and (ii) the elevated portion of the semiconductor wafer is positioned in the chamber. The method also includes the step of advancing a fluid (i) through the chamber, and (ii) into contact with the elevated portion of the semiconductor wafer.

Pursuant to a third embodiment of the present invention, there is provided a method of planarizing a wafer surface of a semiconductor wafer having an elevated portion extending therefrom. The method includes the step of positioning a fluid flow surface relative to the wafer surface so that (i) a space is defined between the wafer surface and the fluid flow surface, and (ii) the elevated portion of the semiconductor wafer is positioned in the space. The method also includes the step of advancing a fluid within the space so that the fluid contacts and erodes the elevated portion of the semiconductor wafer.

It is an object of the present invention to provide a new and useful apparatus and method for planarizing a surface of a semiconductor wafer having an elevated portion extending therefrom.

It is also an object of the present invention to provide an improved apparatus and method for planarizing a surface of a semiconductor wafer having an elevated portion extending therefrom.

It is yet another object of the present invention to provide an apparatus and method for planarizing a surface of a semiconductor wafer having an elevated portion extending therefrom which is relatively reliable.

It is moreover an object of the present invention to provide an apparatus and method for planarizing a surface of a semiconductor wafer having an elevated portion extending therefrom which is relatively inexpensive.

The above and other objects, features, and advantages of the present invention will become apparent from the following description and the attached drawings.

BRIEF DESCRIPTION OF THE DRAWINGS

FIGS. 1A–1F show enlarged sectional views of a semiconductor wafer during various steps of a fabrication process;

FIG. 2 is a diagrammatic view of a exemplary planarizing apparatus which incorporates various features of the present invention therein;

FIG. 3 is an enlarged view of a portion of FIG. 2 which is encircled and indicated as FIG. 3;

FIG. 4 is a view similar to the one shown in FIG. 3, but showing the semiconductor wafer after being processed in the exemplary planarizing apparatus for a first period of time;

FIG. 5 is a view similar to the one shown in FIG. 4, but showing the semiconductor wafer after being processed in the exemplary planarizing apparatus for a second period of time;

FIG. 6 is a view similar to the one shown in FIG. 5, but showing the semiconductor wafer after being processed in the exemplary planarizing apparatus for a third period of time;

FIG. 7 is a view of a second embodiment of the planarizing apparatus of the present invention which is similar to the planarizing apparatus shown in FIG. 2, however, the planarizing apparatus shown in FIG. 7 includes a guide plate having a fluid flow surface which defines a convex curve;

FIG. 8 is a side elevational fragmentary view of the planarizing apparatus of the present invention which is similar to the planarizing apparatus shown in FIG. 2, however, the planarizing apparatus shown in FIG. 8 includes a guide plate having side walls extending therefrom (note that the fluid flow surface is shown in phantom for clarity of description);

FIG. 9 is a transverse cross sectional view of the planarizing apparatus shown in FIG.8.

DETAILED DESCRIPTION OF A PREFERRED EMBODIMENTS

While the invention is susceptible to various modifications and alternative forms, specific embodiments thereof have been shown by way of example in the drawings and will herein be described in detail. It should be understood, however, that there is no intent to limit the invention to the particular forms disclosed, but on the contrary, the intention is to cover all modifications, equivalents, and alternatives falling within the spirit and scope of the invention as defined by the appended claims.

Referring now to FIGS. 1A–1F, there is shown a semiconductor wafer 10 after various steps of a fabrication process of the present invention. In particular, as shown in FIGS. 1A and 1B, the semiconductor wafer 10 includes a semiconductor substrate 12, such as silicon. A first insulating layer 14 and a first metal layer 16 are deposited or otherwise disposed on the semiconductor substrate 12. More specifically, the fabrication process deposits the first insulating layer 14 on the semiconductor substrate 12 such that a contact hole 20 is formed in the first insulating layer 14 at a location above a transistor portion of the semiconductor substrate 12. Moreover, the fabrication process patterns the first metal layer 16 (e.g. aluminum) over the first insulating layer 14 and the contact hole 20. As a result, the first metal layer 16 fills the contact hole 20 thereby forming an electrical contact with the transistor portion of the semiconductor substrate 12. Moreover, the filling of the contact hole 20 forms a pit 22 in the portion of the first metal layer 16 disposed above the contact hole 20.

As shown in FIG. 1C, a second insulating layer 24 is deposited on the outer surface of the first insulating layer 14 and the first metal layer 16. The second insulating layer 24 has an uneven surface topography as a result of the varying topography associated with the first insulating layer 14 and a first metal layer 16. In particular, a number of elevated portions 30 extend from a front side or wafer surface 38 of the semiconductor wafer 10. The uneven surface topography of the second insulating layer 24 may cause accuracy problems in fabricating additional layers associated with the semiconductor wafer 10. For example, the uneven surface topography may cause accuracy problems for a lithography process which is utilized to pattern a second metal layer 26 (see FIG. 1F) on the second insulating layer 24. As shall be discussed below in more detail, in order to avoid such accuracy problems associated with the uneven topography of the second insulating layer 24, a planarizing apparatus, such as a planarizing apparatus 18 (see FIG. 2), planarizes the second insulating layer 24 so as to produce a planar surface 28 (see FIG. 1D) having a desired planarity level. The above process can also be applied to shallow trench isolations.

As alluded to above, once the semiconductor wafer 10 has been planarized to the desired planarity level, additional layers may be deposited or otherwise fabricated thereon. For example, as shown in FIGS. 1E and 1F, a via hole 36 may be etched through the second insulating layer 24. Thereafter, the second metal layer 26 may be deposited on the second insulating layer 24. It should be appreciated that numerous additional layers may be deposited on the semiconductor wafer 10 in the manner previously described.

Referring now to FIG. 2, there is shown a preferred embodiment of the planarizing apparatus 18 which is used to planarize the wafer surface 38 of the semiconductor wafer 10. Planarizing apparatus 18 includes a motor 48, a shaft 84, and a turntable 46. Planarizing apparatus 18 also includes an enclosure 86, a guide plate 32, and a discharge reservoir 56. Planarizing apparatus 18 further includes a source of fluid 50, a flow generator 42 (e.g. a pump), a valve 82, and a source of abrasive particles 59.

Source of abrasive particles 59 contains a plurality of abrasive particles 94 (see FIGS. 3–6) suspended in a fluid such as water. The abrasive particles can be made of, for example, silica, cerium oxide, or alumina oxide. The fluid flow surface 34 of guide plate 32 is preferably made of a hard, abrasive resistant, smooth or polished surfaced material such as silicon carbide. It is further preferable that guide plate 32 is height adjustable so that fluid flow characteristics in chamber 40 can be altered by adjusting the height of guide plate 32.

Shaft 84 of planarizing apparatus 18 has one end thereof mechanically coupled to motor 48. Shaft 84 has the other end thereof mechanically coupled to turntable 46. Enclosure 86 is positioned relative to turntable 46 so that a cavity 88 is defined by enclosure 86 and turntable 46. Semiconductor wafer 10 is positioned on turntable 46 such that semiconductor 10 is located within cavity 88. Guide plate 32 is also positioned within cavity 88 vertically above wafer surface 38 of semiconductor wafer 10. In particular, guide plate 32 is spaced apart from wafer surface 38 so that a chamber 40 is defined between a fluid flow surface 34 of guide plate 32 and wafer surface 38. With respect to the distance fluid flow surface 34 is spaced apart from wafer surface 38, fluid flow surface 34 is preferably located one millimeter or less from wafer surface 38 although there are other applications where the spacing of greater than one millimeter can be used. It should be appreciated that positioning semiconductor wafer 10 relative to guide plate 32 in the above described manner results in elevated portions 30 extending from wafer surface 38 being positioned within chamber 40 as shown in FIG. 3.

It should also be appreciated that guide plate 32 can include a pair of closely spaced adjacent side walls 110 and 112 extending therefrom so that fluid flow surface 34 is interposed between side walls 110 and 112 as shown in FIGS. 8 and 9. Guide plate 32 is typically positioned such that there exists approximately a one millimeter gap interposed between the side wall 110 and wafer 10, a one millimeter gap interposed between side wall 112 and wafer 10, and a gap larger than one millimeter interposed between fluid flow surface 34 and wafer 10. Having side walls 110 and 112 extending from guide plate 32 in the above described manner results in fluid flow surface 34, side walls 110 and 112, and wafer surface 38 defining chamber 40. Having chamber 40 defined by the aforementioned elements results in chamber 40 possessing the shape of an elongated channel which has a rectangular shaped transverse cross section as shown in FIG. 9. It should be understood that other transverse cross sections are contemplated such as a triangular transverse cross section.

Chamber 40 includes an inlet 52 and an outlet 54 both of which are defined in enclosure 86. Outlet 54 is coupled to a fluid line 90. Fluid line 90 is in turn coupled to discharge reservoir 56, thereby placing outlet 54 in fluid communication with discharge reservoir 56. It should be appreciated that fluid line 90 could also be coupled to valve 82, allowing the outgoing fluid to be recycled through a fluid line 78. Inlet 52 is coupled to fluid line 78. Fluid line 78 is in turn coupled to valve 82, thereby placing valve 82 in fluid communication with inlet 52. Valve 82 is in fluid communication with flow generator 42 and source of abrasive particles 59 via fluid lines 76 and 80, respectively. In addition, flow generator 42 is in fluid communication with source of fluid 50 via a fluid line 98.

It should be appreciated that valve 82 is positionable between a first position, a second position, and a third position. When valve 82 is located in the first position fluid can advance from fluid line 76, through valve 82, to fluid line 78. However, fluid is prevented from being advanced from fluid line 80, though valve 82, to fluid line 78 when valve 82 is located in the first position. When fluid valve 82 is located in the second position fluid can (i) advance from fluid line 76, through valve 82, to fluid line 78 and (ii) advance from fluid line 80, through valve 82, to fluid line 78. When valve 82 is located in the third position fluid is prevented from being advanced from fluid line 76 or fluid line 80 through valve 82. It should further be appreciated that valve 82 can be configured to allow other fluids to be input such as a premixed slurry of particles and fluid, a cleaning solution, or fluid line 90 to recycle used fluid.

When flow generator 42 is actuated and valve 82 is located in the first position, flow generator 42 draws fluid from source of fluid 50 via fluid line 98. So as to induce overall turbulent flow and also to generate flow at the boundaries of chamber 40, flow generator 42 can also function so as to emit a pulsed flow of fluid through channel 40. Flow generator 42 then advances the fluid through fluid line 76, valve 82, and fluid line 78 in the direction indicated by arrows 96 and 100. From fluid line 78 the fluid is advanced through inlet 52 and into chamber 40. The fluid is then advanced through chamber 40 in the direction indicated by arrow 102. After passing through chamber 40 the fluid is advanced through outlet 54 and enters fluid line 90. Once in fluid line 90 the fluid is directed to discharge reservoir 56.

When flow generator 42 is actuated and valve 82 is located in the second position, fluid is advanced along the same fluid path as described above in reference to valve 82 being located in the first position. However, in addition to fluid being withdrawn from source of fluid 50, fluid and abrasive particles 94 (see FIGS. 3–6) are withdrawn from source of abrasive particles 59 and advanced into valve 82 where abrasive particles 94 are mixed with the fluid being advanced into fluid line 78. The fluid and abrasive particles 94 are then advanced through chamber 40 and into discharge reservoir 56 in an identical manner as described above when valve 82 is located in the first position.

It should be appreciated that when guide plate 32 includes side walls 110 and 112, only section 114 of wafer surface 38 is interposed between side walls 110 and 112. Therefore, section 114 of wafer surface 38 is exposed to the majority of the abrasive particles 94 and/or the fluid being advanced through chamber 40. However, as semiconductor wafer 10 is rotated in the above described manner, the entire wafer surface 38 is repeatedly exposed to the abrasive particles 94 and/or the fluid being advanced through chamber 40.

When valve 82 is located in the third position, fluid is prevented from being advanced into fluid line 78 via fluid line 76 or fluid line 80. Therefore, when valve 82 is in the third position flow generator 42 will typically be deactuated so that no fluid is being withdrawn from source of fluid 50.

As shown in FIG. 2, to planarize wafer surface 38 of semiconductor wafer 10, semiconductor 10 is positioned on turntable 46. It should be understood that semiconductor wafer 10 is preferably secured to turntable 46 by any appropriate well known manner. For example, semiconductor wafer 10 can be secured to turntable 46 by a vacuum mechanism (not shown). As discussed above, turntable 46 and semiconductor 10 are then positioned relative to enclosure 86 so that semiconductor 10 is located in cavity 88. In addition, turntable 46 and semiconductor 10 are positioned relative to enclosure 86 so that wafer surface 38 is located adjacent to fluid flow surface 34 of guide plate 32 and chamber 40 is defined therebetween. As stated previously stated, fluid flow surface 34 is located about one millimeter from wafer surface 38.

After locating semiconductor wafer 10 in the above described manner, motor 48 is actuated so that turntable 46 and semiconductor wafer 10 are rotated relative to enclosure 86 and guide plate 32 around an axis 104 in the direction indicated by arrow 92. Rotating semiconductor 10 around axis 104 facilitates the uniform planarization of wafer surface 38. Valve 82 is then located in the first position. Flow generator 42 is then actuated so that fluid is advanced through chamber 40 as previously described.

In regards to the flow rate of the fluid passing through the chamber 40 it should be understood that the fluid being advanced through chamber 40 and any of the abrasive particles 94 contained in the fluid must possess enough kinetic energy to efficiently erode the elevated portions 30.

As shown in FIG. 3, having semiconductor wafer 10 located in the above described manner results in elevated portion 30 extending into chamber 40. Having elevated portion 30 located in chamber 40 while fluid is advanced through chamber 40 by flow generator 42 results in the fluid flowing over elevated portion 30 as indicated by arrows 96. It should be understood that having the fluid flow over elevated portion 30 in the described manner causes elevated portion 30 to undergo erosion. What is meant herein by erosion is the gradual wearing away of elevated portion 30 by the flow of fluid thereover. In particular, FIGS. 3–6 schematically show the sequential progression of elevated portion 30 being eroded away by the advancement of the fluid through chamber 40. Specifically, FIG. 3 shows elevated portion 30 during the initial stages of advancing the fluid through chamber 40. FIG. 4 shows elevated portion 30 after being exposed to the flow of fluid for a first period of time. Note that elevated portion 30 is beginning to erode or wear away as the fluid comes into contact with and flows over elevated portion 30. FIG. 5 shows elevated portion 30 after being exposed to the flow of fluid for a second period of time (note that the second period of time is longer than the first period of time). As shown in FIG. 5, exposing elevated portion 30 to the fluid flow for a greater period of time (i.e. the second period of time) causes elevated portion 30 to erode away even further so that only a relatively small amount of elevated portion 30 is left extending from wafer surface 38. FIG. 6 shows wafer surface 38 after being exposed to the flow of fluid for a third period of time (note that the third period of time is longer than the second period of time). As shown in FIG. 6 exposing wafer surface 38 to the flow of fluid for the third period of time results in elevated portion 30 being substantially removed from wafer surface 38 so as to produce planar surface 28.

It should be understood that planarizing apparatus 18 can also be operated in a manner identical to that described above but with valve 82 positioned in the second position. As previously discussed, when valve 82 is located in the second position abrasive particles 94 from source of abrasive particles 59 are mixed with the fluid being advanced through fluid line 78 and chamber 40. Therefore, when planarizing apparatus 18 is operated with valve 82 located in the second position abrasive particles 94 are advanced through chamber 40 along with the fluid as shown in FIGS. 3–6. Having abrasive particles 94 mixed or suspended in the fluid advanced through chamber 40 results in abrasive particles 94 impacting elevated portion 30 as shown in FIGS. 3–5. The impact of abrasive particles 94 against elevated portion 30 facilitates the erosion of elevated portion 30 so as to produce planar surface 28 in a more efficient manner. For example, having abrasive particles 94 suspended in the fluid being advanced through chamber 40 will decrease the time it takes to remove elevated portion 30 and produce planar surface 28.

The fluid advanced through chamber 40 can be water. The fluid advanced through chamber 40 can also be other fluids as long as they result in the erosion of elevated portion 30. In addition, various chemicals for enhancing the erosion of elevated portion 30 can be mixed with the water or the other fluids being advanced through chamber 40. These types of chemicals will also increase the efficiency with which planarizing apparatus 18 produces planar surface 28 on semiconductor 10. Examples of chemicals which can be added to the fluid 44 being advanced through chamber 40 include ammonium hydroxide, potassium hydroxide, and nitric acid. The chemicals used in a specific instance are varied based on the specific abrasive particle 94 being used and the pH level needed to keep the particle 94 suspended in the fluid 44.

After removing substantially all of the elevated portions 30 present on semiconductor wafer 10 in the above described manner, motor 48 is deactuated so that turntable 46 and semiconductor wafer 10 stop rotating. Flow generator 42 is then deactuated and valve 82 located in the third position. Semiconductor wafer 10 is then removed from turntable 46. Once removed from turntable 46 additional layers may be deposited or otherwise fabricated on planar surface 28 as previously discussed.

Referring now to FIG. 7, there is shown a second embodiment of the present invention. In particular, FIG. 7 shows a planarizing apparatus 106 which is substantially identical to planarizing apparatus 18. In particular, planarizing apparatus 106 includes the same elements, is structurally similar, and functions in a substantially identical manner as described above for planarizing apparatus 18. However, planarizing apparatus 106 includes a guide plate 63 which possesses a convex side and a concave side. In particular, guide plate 63 has a fluid flow surface 72 which defines a convex curve.

Guide plate 63 is utilized in much the same way as guide plate 32. Specifically, during use of planarizing apparatus 106, guide plate 63 is positioned within cavity 88 of enclosure 86, and a chamber 65 is defined between wafer surface 38 and fluid flow surface 72. However, it should be understood that since fluid flow surface 72 defines a convex curve the configuration of chamber 65 is somewhat different from the configuration of chamber 32 (see FIG. 2). In particular, (i) chamber 65 possesses a first width $W_1$ defined between fluid flow surface 72 and wafer surface 38 at inlet 52 of chamber 65, (ii) chamber 65 also possesses a second width $W_2$ defined between fluid flow surface 72 and wafer surface 38 at an intermediate location 61 of chamber 65 which is located between inlet 52 and outlet 54, and (iii) first width $W_1$ is greater than second width $W_2$. It should be appreciated that an increase or decrease in the first width $W_1$ will manifest in decreased or increased flow rate respectively in that area of chamber 40. Likewise, adjustments in the second width $W_2$ will also result in a changed flow rate in that area of chamber 40.

Adjusting the shape of guide plate 63 in the above described manner results in a greater degree of erosion talking place on the portion of semiconductor wafer 10 which is positioned at intermediate location 61 of chamber 65 as fluid (with or without abrasive particles) is advanced through chamber 65 by flow generator 42. This is true since the distance between wafer surface 38 and fluid flow surface 72 is smaller at intermediate location 61 as compared to the portions of semiconductor 10 located adjacent to inlet 52 and outlet 54. Therefore, it should be appreciated that by adjusting the distance between wafer surface 38 and fluid flow surface 72 as described above, different areas of semiconductor wafer 10 can be subjected to a greater or lesser degree of erosion.

Being able to control which portions of semiconductor wafer 10 are eroded to a greater degree as compared to other portions is desirable since it provides greater control over the planarization process. For example, under certain semiconductor manufacturing situations it is desirable to remove (i.e. erode) more material from the center of the semiconductor wafer as compared to the edges. Under these circumstances guide plate 63 would be used, as shown in FIG. 7, since the convex configuration of guide plate 63 accomplishes this goal. On the other hand, if a relatively uniform removal (i.e. erosion) of material from the semiconductor is desired then guide plate 32 would be utilized, as shown in FIG. 2.

It should also be understood that other curved configurations other than the above described convex shape are contemplated for the guide plate of the present invention depending upon what areas of the semiconductor need to be subjected to a greater degree of erosion. For example, the guide plate could be configured so that the fluid flow surface defines a concave curve, thereby subjecting the edges of the semiconductor to a greater degree of erosion as compared to the center.

In light of the above discussion it should be appreciated that the present invention provides a planarizing apparatus that is less mechanically complex as compared to other planarizing apparatus designs. Therefore, the planarizing apparatus of the present invention is relatively reliable as compared to the other designs. In addition, it should also be appreciated that the planarizing apparatus of the present invention, in contrast to other planarizing apparatus designs, does not utilize consumables such as polishing pads or backing films which wear out and have to be periodically replaced. Therefore, the planarizing apparatus of the present invention is relatively inexpensive to operate, and thus decreases the cost of manufacturing semiconductor wafers.

While the invention has been illustrated and described in detail in the drawings and foregoing description, such illustration and description is to be considered as exemplary and not restrictive in character, it being understood that only preferred embodiments have been shown and described and that all changes and modifications that come within the spirit of the invention are desired to be protected.

What is claimed is:

1. A method of planarizing a wafer surface of a semiconductor wafer having an elevated portion extending therefrom, comprising the steps of:
   positioning a fluid flow surface relative to said wafer surface so that (i) a chamber is defined between said wafer surface and said fluid flow surface, and (ii) said elevated portion of said semiconductor wafer is positioned in said chamber; and
   advancing a fluid (i) through said chamber, and (ii) into contact with said elevated portion of said semiconductor wafer, wherein
      said chamber includes a first location and a second location,
      said chamber defines a first width between said fluid flow surface and said wafer surface at said first location of said chamber,
      said chamber defines a second width between said fluid flow surface and said wafer surface at said second location of said chamber, and
      said first width is different than said second width.

2. The method of claim 1, further comprising the step of rotating semiconductor wafer during said advancing step.

3. The method of claim 1, wherein said fluid consists essentially of water.

4. The method of claim 1, wherein said fluid includes a planarizing chemical selected from the group consisting of: ammonium hydroxide, potassium hydroxide, and nitric acid.

5. A method of planarizing a wafer surface of a semiconductor wafer having an elevated portion extending therefrom, comprising the steps of:
   positioning a fluid flow surface relative to said wafer surface so that (i) a chamber is defined between said wafer surface and said fluid flow surface, and (ii) said elevated portion of said semiconductor wafer is positioned in said chamber; and
   advancing a fluid (i) through said chamber, and (ii) into contact with said elevated portion of said semiconductor wafer, wherein:
      said chamber defines an inlet and an outlet,
      an intermediate location of said chamber is located between said inlet and said outlet,
      said fluid flow surface defines a convex curve,
      said chamber possesses a first width defined between said fluid flow surface and said wafer surface at said inlet of said chamber,
      said chamber possesses a second width defined between said fluid flow surface and said wafer surface at said intermediate location of said chamber, and
      said first width is greater than said second width.

6. A method of planarizing a wafer surface of a semiconductor wafer having an elevated portion extending therefrom, comprising the steps of:
   positioning a fluid flow surface relative to said wafer surface so that (i) a space is defined between said wafer surface and said fluid flow surface, and (ii) said elevated portion of said semiconductor wafer is positioned in said space; and
   advancing a fluid within said space so that said fluid contacts and erodes said elevated portion of said semiconductor wafer, wherein:
      said space includes a first location and a second location,
      said space possesses a first width defined between said fluid flow surface and said wafer surface at said first location of said space,
      said space possesses a second width defined between said fluid flow surface and said wafer surface at said second location of said space, and
      said first width is different than said second width.

7. The method of claim 6, wherein said advancing step is continued until substantially all of said elevated portion is eroded and said wafer surface is substantially planar.

8. The method of claim 6, further comprising the step of rotating semiconductor wafer during said advancing step.

9. The method of claim 6, wherein said fluid consists essentially of water.

10. The method of claim 6, wherein said fluid includes a planarizing chemical selected from the group consisting of: ammonium hydroxide, potassium hydroxide, and nitric acid.

11. The method of claim 6, wherein:
   said space has an inlet and an outlet,
   an intermediate location of said space is located between said inlet and said outlet,
   said fluid flow surface defines a convex curve,
   said space possesses a first width defined between said fluid flow surface and said wafer surface at said inlet of said space,
   said space possesses a second width defined between said fluid flow surface and said wafer surface at said intermediate location of said space, and
   said first width is greater than said second width.

12. The method of claim 1, wherein:
   said chamber defines an inlet and an outlet,
   said first location is at said inlet, and
   said second location of said chamber is located between said inlet and said outlet.

13. The method of claim 12, wherein said first width is greater than said second width.

14. The method of claim 1, wherein said fluid flow surface defines a convex curve.

15. The method of claim 1, wherein said fluid flow surface is nonplanar.

16. The method of claim 6, wherein:
   said space has an inlet and an outlet,
   said first location is at said inlet, and
   said second location of said space is located between said inlet and said outlet.

17. The method of claim 16, wherein said first width is greater than said second width.

18. The method of claim 6, wherein said fluid flow surface defines a convex curve.

19. The method of claim 6, wherein said fluid flow surface is nonplanar.

* * * * *